(12) United States Patent
Matsufusa et al.

(10) Patent No.: US 6,744,143 B1
(45) Date of Patent: Jun. 1, 2004

(54) SEMICONDUCTOR DEVICE HAVING TEST MARK

(75) Inventors: Jiro Matsufusa, Tokyo (JP); Tomoharu Mametani, Tokyo (JP); Takeshi Kishida, Tokyo (JP); Yoji Nakata, Tokyo (JP); Yukihiro Nagai, Tokyo (JP); Hiroaki Nishimura, Tokyo (JP); Akinori Kinugasa, Tokyo (JP); Shigenori Kido, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 253 days.

(21) Appl. No.: 09/620,718

(22) Filed: Jul. 20, 2000

(30) Foreign Application Priority Data

Jan. 25, 2000 (JP) ........................................ 2000-015760

(51) Int. Cl.$^7$ ............................................. H01L 23/544
(52) U.S. Cl. ....................................................... 257/797
(58) Field of Search ........................... 438/18, 401, 462, 438/975, 460, 461; 257/797, 283

(56) References Cited

U.S. PATENT DOCUMENTS 6,093,640 A * 7/2000 Hsu et al. ................... 438/631
6,118,185 A * 9/2000 Chen et al. .................. 257/797

FOREIGN PATENT DOCUMENTS

JP 10-189417 7/1998
JP 11-31645 2/1999

* cited by examiner

Primary Examiner—Long Pham
Assistant Examiner—Ginette Peralta
(74) Attorney, Agent, or Firm—McDermott, Will & Emery

(57) ABSTRACT

A semiconductor device having a test mark comprising: a semiconductor substrate; a first TEOS layer formed on the semiconductor substrate; a second TEOS layer formed on the first TEOS layer and having a fluidity lower than that of the first TEOS layer at an elevated temperature; a recess formed in the first and second TEOS layers and exposing the surface of the semiconductor substrate, wherein the horizontal cross section of the recess is substantially rectangular in configuration; and a metal layer formed between the first and second TEOS layers and opposing to the corner of the recess.

8 Claims, 10 Drawing Sheets

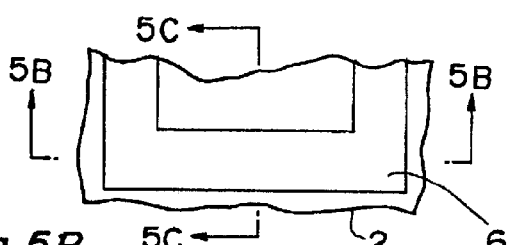
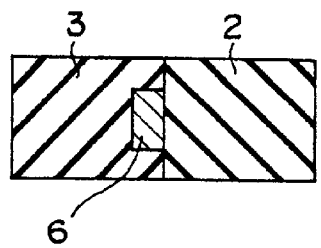
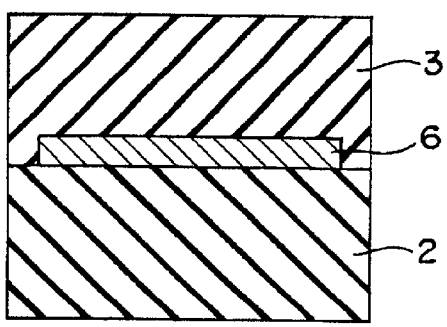
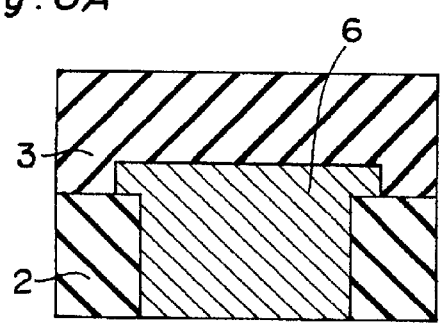
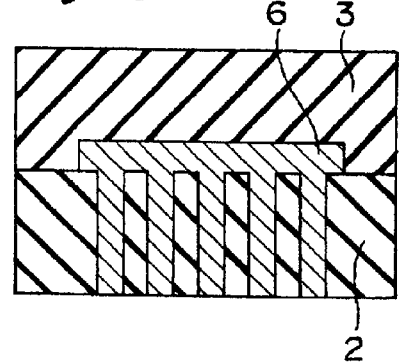

SEMICONDUCTOR DEVICE HAVING TEST MARK

BACKGROUND OF THE INVENTION

1. Field of the Invention

The present invention relates to a semiconductor device having a test mark and, more particularly, to a semiconductor device in which an extension of a crack from the test mark is prevented.

2. Description of the Related Art

Referring to FIG. 13A, a semiconductor wafer 10 contains a plurality of block portions 11. In the process of fabricating semiconductor elements on the semiconductor wafer 10, each of the block portions 11 is exposed to light in one shot process.

Referring to FIG. 13B, which shows an enlarged block portion 11, a plurality of semiconductor chips 12 are fabricated in the block portion 11, and also dicing lines or tracks 13 along which the block portion 11 will be diced and separated into semiconductor chips 12 are formed between the semiconductor chips 12. Generally, a test mark (not shown) is formed in the dicing line 13, for example, for measuring a thickness of a deposited layer, determining overlay accuracy, or measuring a characteristic of a device.

Referring next to FIG. 14A, there is shown an enlarged plan view of a test mark fabricated in the dicing line. Also, a cross sectional view along lines B—B in FIG. 14A is shown in FIG. 14B. As shown, a semiconductor substrate 21 bears a first insulating layer 22 made of tetraethyl orthosilicate including boron and phosphorus which has good characteristic of step coverage, referred to "BPTEOS layer" hereinafter, which in turn supports a second insulating layer 23 made of tetraethyl orthosilicate, referred to "TEOS layer" hereinafter. A recess or concave 24 for use as a test mark is formed in the TEOS and BPTEOS layers, 22 and 23, and terminated at the surface of the substrate 21 facing to the BPTEOS layer 22. When viewed from above, i.e., from the direction indicated by the arrow 29 in FIG. 14B, the recess 24 has a square in configuration defined by four vertical walls, and one side of the square recess 24 is about 10 to 100 μm in length.

Disadvantageously, the BPTEOS layer 22 is melted or deformed in a heat treatment such as a sintering step, on the other hand, the TEOS layer 23 is scarcely deformed in the step. This results in that cracks 27 are formed in the BPTEOS layer 22 at the corner of the recess 24 near the TEOS layer 23 as shown in FIG. 14A. The cracks 27 extend outwardly and then destroy the semiconductor elements or another test marks (not shown) fabricated on the semiconductor substrate 21.

Particularly, the test mark has a large area in horizontal cross section such as a square configuration of 10 μm×100 μm or a rectangular configuration of 1 μm×100 μm, for example, and has four corners. Therefore, stresses concentrate at these corners by the deformation of the BPTEOS layer 22, causing the formation of the cracks 27.

In order to prevent formation of the cracks 27, a structure shown in FIGS. 15A and 15B has been proposed. In the structure, a metal layer 25 such as a capacitor lower electrode is formed on the BPTEOS 22 as a stop layer, thereby a recess 24 is formed only in the TEOS layer 23 above the metal layer 25.

However, for example, the thickness of the TEOS layer 23 can not be measured exactly by the use of the test mark. This is because the metal layer 25 is formed in the TEOS layer 23. Therefore, the test mark is prohibited from being used for the measurement of the thickness of the TEOS layer 23. Also, the presence of the metal layer 25 prevents the exact determination of overlay accuracy. Therefore, the mark is not used for determining overlay accuracy.

SUMMARY OF THE INVENTION

Accordingly, an object of the present invention is to provide a semiconductor device having a test mark which prevents extension of a crack arisen at the corner of a recess which is used as a test mark, thereby adverse affect to a semiconductor element by the crack is prevented.

To this end, the inventors of the present invention have made intensive research on this subject. As a result, the inventors have found that by forming a metal layer on the BPTEOS layer near the corners of the recess, thereby the extension of the cracks formed in the BPTEOS layer can be terminated by the metal layer.

That is, present invention provides a semiconductor device having a test mark. The device comprises a semiconductor substrate; a first TEOS layer formed on the semiconductor substrate; a second TEOS layer formed on the first TEOS layer and having a fluidity lower than that of the first TEOS layer at high or an elevated temperature; a recess formed in the first and second TEOS layers and terminated at the surface of the semiconductor substrate, wherein the horizontal cross section of the recess is substantially rectangular in configuration; and a metal layer formed between the first and second TEOS layers and opposing to the corner of the recess.

In the case that a crack is arisen in the first TEOS layer at the corner of recess by the deformation of the first TEOS layer, the extension of the crack can be terminated by the metal layer. Thereby, the destruction of a semiconductor element or another test mark, which is caused by the extension of the crack, can be prevented.

The first TEOS layer may contain boron and/or phosphorus. Such a TEOS layer containing boron and/or phosphorus, which is referred as a BPTEOS layer, is easy to melt or deform, so that a crack is easy to arise.

Preferably, the metal layer is a square-shaped layer surrounding the recess. By use of such a metal layer, the extension of a crack can be terminated.

The metal layer may be an L-shaped layer surrounding the corner of the recess. This is because that most of the cracks are arisen at the corner of the recess and extend in a diagonal direction of the recess.

The metal layer may be a delta-shaped layer of which one side opposes to the corner of the recess. The extension of a crack can be terminated effectively by such a metal layer.

Also, a semiconductor device of the present invention may further comprise an outer metal layer formed outside of the metal layer so that the outer metal layer opposes to the corner of the recess through the metal layer.

A crack that extends through and outward the metal layer can be terminated by the outer metal layer.

Also, a semiconductor device of the present invention may further comprise a lower metal layer embedded in the first TEOS layer which extends between the top and bottom surfaces each neighboring to the semiconductor substrate and the metal layer. The extension of a crack can be terminated effectively by such an embedded metal layer.

The lower metal layer may consist of a plurality of cylindrical metal layers.

As can be seen from above description, a crack extended from the corner of the recess for use as a test mark can be terminated by the metal layer which is formed around the recess. Thereby, a production yield of a semiconductor device having such a test mark can be increased.

BRIEF DESCRIPTION OF THE DRAWINGS

FIGS. 4 to 12 are a semiconductor device having another test mark according to this invention;

DETAILED DESCRIPTION OF THE PREFERRED EMBODIMENTS

Figure 1A:
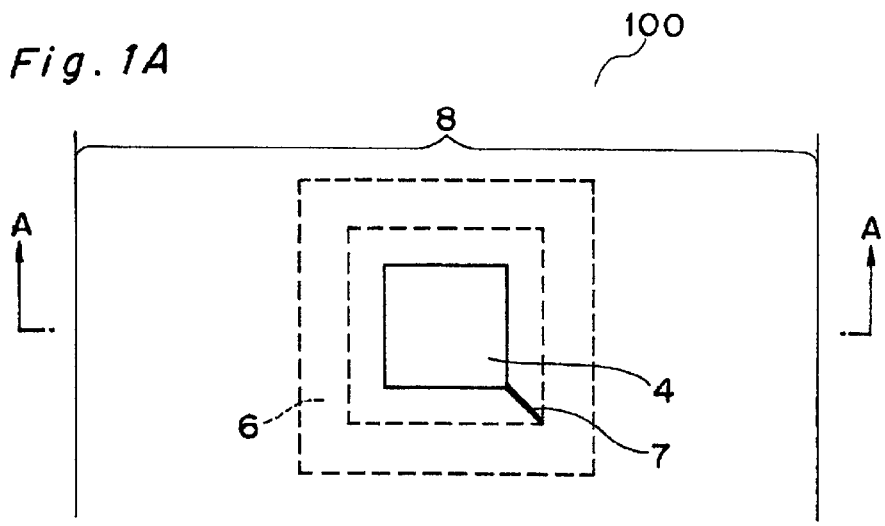
FIG. 1A is a plan view of a semiconductor device having a test mark according to the present invention.

Referring to FIG. 1A, there is shown an enlarged partial plan view of the semiconductor device generally indicated by reference numeral 100. The semiconductor device is formed at its one surface with a dicing line 8 having a certain width, along which a grooving or dicing will be done.

Figure 1B:
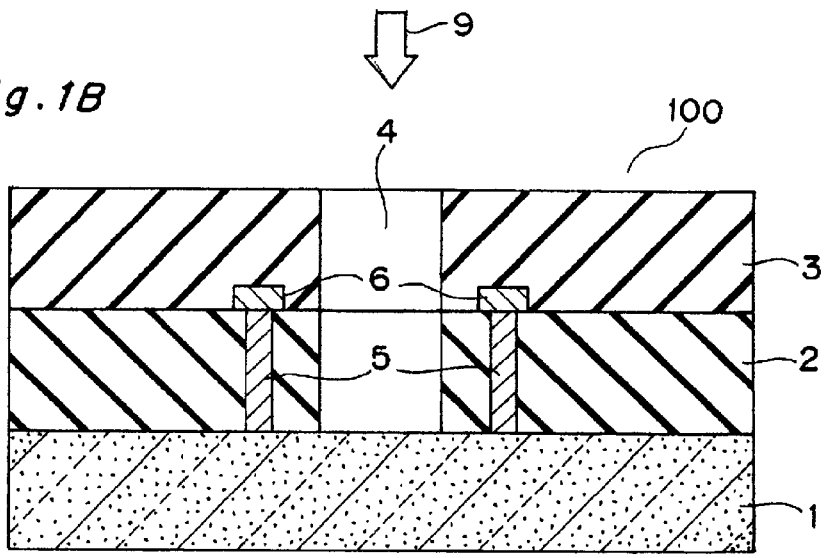
FIG. 1B is a cross sectional view of the semiconductor device along lines A—A in FIG. 1A.

FIG. 1B shows a cross sectional view of a part of the semiconductor device 100 along lines A—A in FIG. 1A. As can be seen from this drawing, the semiconductor device 100 includes a substrate 1 on which semiconductor elements (not shown) are integrated. For clarify, the semiconductor elements are eliminated from the drawings. The semiconductor substrate 1 bears a first insulating layer 2 made of tetraethyl orthoslicate including boron and phosphorus, referred to as "BPTEOS layer" hereinafter, which in turn supports a second insulating layer 3 made of tetraethyl orthoslicate, referred to as "TEOS layer" hereinafter.

Within the dicing line 8, a recess or concave 4 for use as a test mark is formed in the first and second layers, BPTEOS and TEOS layers 2 and 3, which terminates at the surface of the substrate 1 facing to the BPTEOS layer 2. When viewed from above, i.e., from the direction indicated by the arrow 9 in FIG. 1B, the recess 9 has a square in configuration defined by four vertical walls. It may be envisioned that the recess 4 is a rectangular in configuration.

The BPTEOS layer 2 includes a first metal layer 5 leaving a certain space from and running around the recess 4. In this embodiment, the first layer extends between the top and bottom surfaces each neighboring to the TEOS layer 3 and the substrate 1. The formation of this metal layer 5 will be described later. Also, the TEOS layer 3 includes a second metal layer 6 embedded in its bottom surface facing to the BPTEOS layer 2. The second metal layer 6 runs along the first metal layer 5. As can be seen from FIG. 1B, the second metal layer 6 has s width greater than that of the first metal layer 5.

It should be noted that the BPTEOS layer 2 is made of material having a specific melting point which is less than a temperature in which the semiconductor device 100, after it is mounted with various parts, is heat treated to fuse electrical connecting parts such as solder bumps. In contrast, the TEOS layer 3 is made of material having a specific melting point greater than the fusing temperature. As a result, in the heat treatment, the BPTEOP layer 2 melts or softens. The TEOS layer 3, on the other hand, does not melt or soften in the heat treatment. This may result in a crack 7 at each corner of the square recess 4 of the BPTEOS layer 2.

This crack 7 tends to extend in a diagonal direction as shown in FIG. 1A, but it terminates at the metal layer 6 and will never extend beyond the metal layer 6. This is advantageous that the crack 7 would never provided adverse affect to the semiconductor elements or other recesses (not shown) disposed outside the metal layer 6.

Figure 2A:
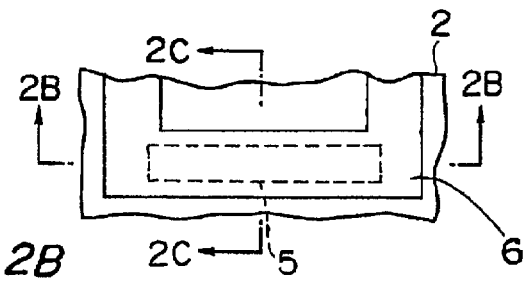
FIGS. 2A to 2C are a semiconductor device according to the present invention.
Figure 2C:
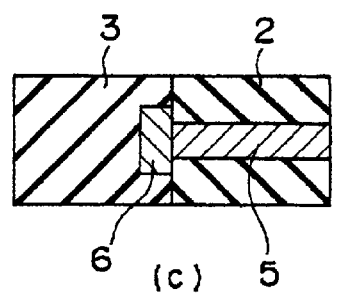
Figure 2B:
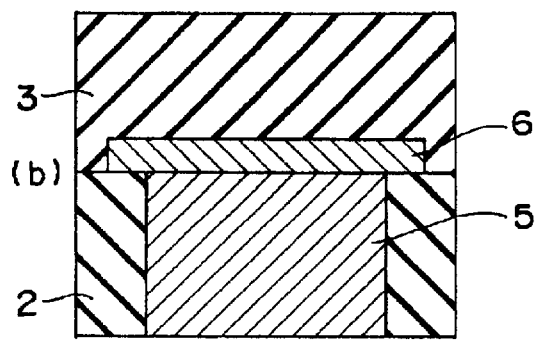

FIG. 2A is a partial plan view of the semiconductor device 100 shown in FIG. 1A. In FIG. 2A, the TEOS layer 3 is eliminated from the drawing. FIG. 2B is a cross sectional view of the semiconductor device 100 along lines 2B—2B in FIG. 2A, and FIG. 2C is a cross sectional view of the semiconductor device 100 along lines 2C—2C in FIG. 2A. In FIGS. 2B and 2C, the substrate 1 is eliminated from the drawings. As shown in FIGS. 2A to 2C, the first metal layer 5 is plate-shaped and extends through the BPTEOS layer 2 between the substrate 1 and the second metal layer 6.

Referring next to the FIGS. 3A to 3G, the method for fabricating the semiconductor device having a test mark will be described.

Figure 3A:
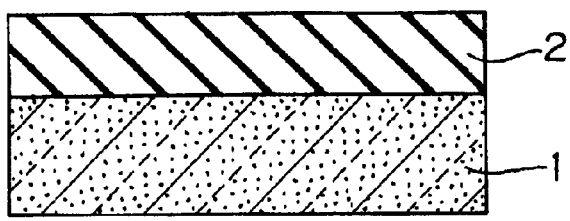
FIGS. 3A to 3G are cross sectional views of a semiconductor device at different steps in its producing process according to the present invention.
Figure 3B:
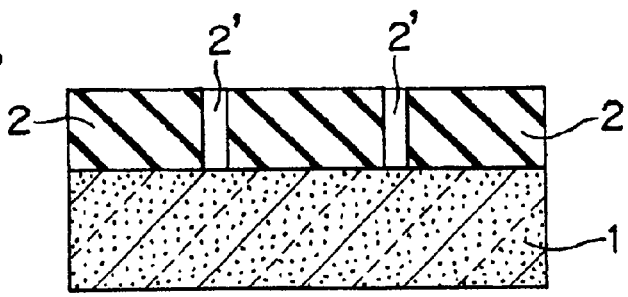

In this process, as shown in FIG. 3A, a BPTEOS layer 2 is formed on a semiconductor substrate 1 as a first insulating layer. Also, as shown in FIG. 3B, by use of conventional photolithography and etching techniques, grooves 2' are formed in the BPTEOS layer 2.

Figure 3C:
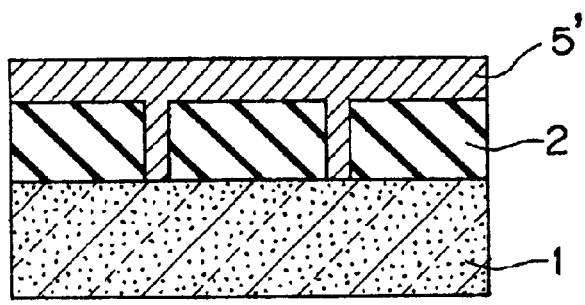
Figure 3D:
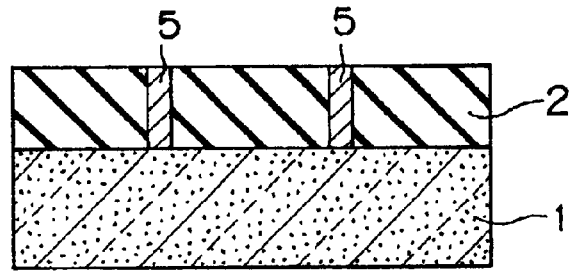

Subsequently, as shown in FIG. 3C, a first metal material layer 5' is deposited on the entire surface of the BPTEOS layer 2 so as to embed the grooves 2'. Then, by use of conventional CMP or etch back techniques, the first metal material layer 5' is polished so as to remain in the grooves 2'. The remained first metal material layers 5' are used as metal layers 5 as shown in FIG. 3D.

Figure 3E:
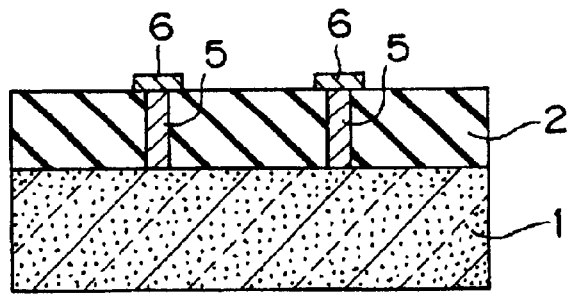

Then, as shown in FIG. 3E, a second metal material layer (not shown) is deposited on the BPTEOS layer 2 and the metal layers 5, in turn, it is patterned to form a second metal layer 6. The second metal layer 6 runs along and covers the first metal layers 5 continuously as shown in FIG. 3E.

Figure 3F:
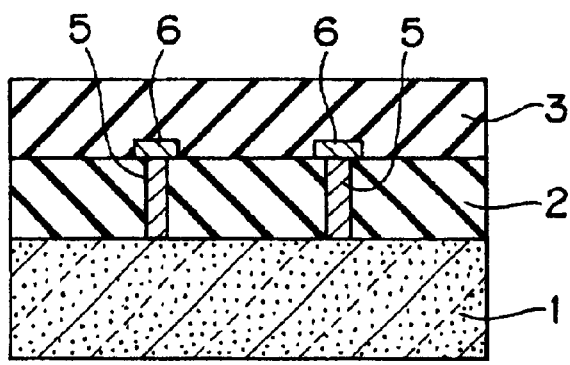
Figure 3G:
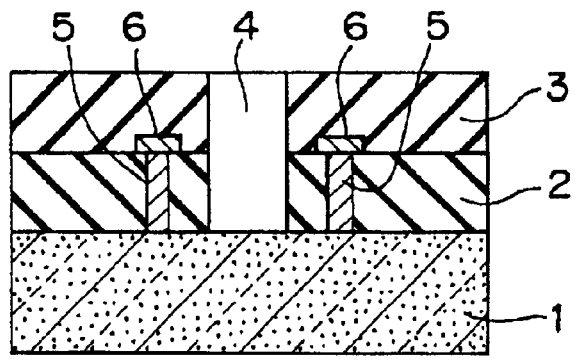

Finally, as shown in FIG. 3F, a TEOS layer is deposited on the BPTEOS layer 2 and the second metal layer 6. Also, as shown in FIG. 3G, the TEOS and PBTEOS layers, 3 and 2, are etched, so that a recess or concave 4 is formed which is used as a test mark. Then a semiconductor device 100 according to this embodiment is accomplished.

It is noted that preferably the first and second metal layers, 5 and 6, may be made from aluminum, copper or aluminum silicate.

Figure 4A:
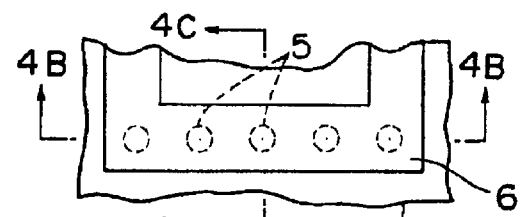
Figure 4C:
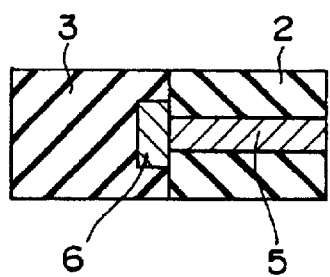
Figure 4B:
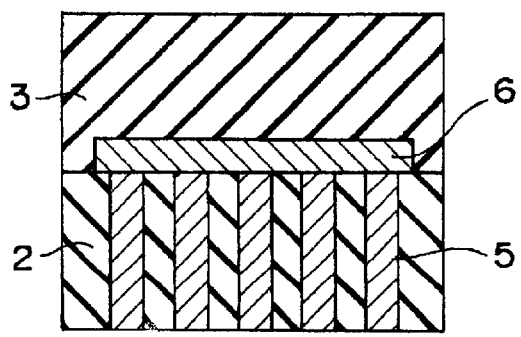

In FIG. 4A, there is shown a partial plan view of a semiconductor device of another variation of this embodiment, in which the TEOS layer 3 is eliminated from the drawing. FIG. 4B is a cross sectional view of the semiconductor device along lines 4B—4B in FIG. 4A, and FIG. 4C is a cross sectional view of the semiconductor device along lines 4C—4C in FIG. 4A. In FIGS. 4B and 4C, the substrate 1 is eliminated from the drawings.

As illustrated in these drawings, a plurality of the metal layers, each of which is cylindrical and extends between the top and the bottom surfaces of the BPTEOS layer 2, may be used as a first metal layers 5.

FIG. 5A is a partial plan view of a semiconductor device of another variation of this embodiment, in which the TEOS layer 3 is eliminated from the drawing. FIG. 5B is a cross sectional view of the semiconductor device along lines 5B—5B in FIG. 5A, and FIG. 5C is a cross sectional view of the semiconductor device along lines 5C—5C in FIG. 5A. In FIGS. 5B and 5C, the substrate 1 is eliminated from the drawings.

As illustrated in these drawings, no first metal layer is formed beneath the second metal layer 6. That is, only the second metal layer 6 terminates the extension of the crack from the corner of the test mark (not shown).

In the producing process described above, the first and second metal layers, 5 and 6, are formed in the separate steps, however, these layers may be formed in one step. That is, after the first metal material layer 5' is deposited on the BPTEOS layer 2 as shown in FIG. 3C, the first and second metal layers, 5 and 6, are formed simultaneously by use of conventional photolithography and etching techniques. This result in that the first and second metal layers, 5 and 6, are formed from the first metal material layer 5' as shown in FIGS. 6A and 6B, which are cross sectional views of a semiconductor device.

Referring to FIGS. 7 to 12, preferred formations of the second metal layer 6 on the BPTEOS layer 2 are shown. The FIGS. 7 to 12 are partial top views of a semiconductor device 100 having a test mark 4. For clarify, TEOS layers are eliminated from these drawings.

Figure 7:
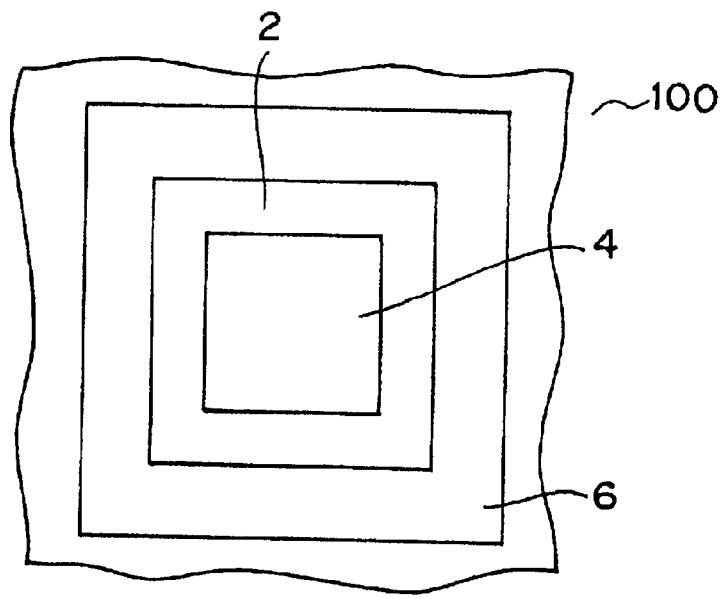

As shown in FIG. 7, the second metal layer 6 may be formed to surround and leave a certain space from the recess 4, so that the second metal layer 6 is a square-shaped layer. By surrounding the recess 4 by the second metal layer 6, extension of a crack from the corner of the recess 4 can be terminated by the second metal layer 6.

Figure 8:
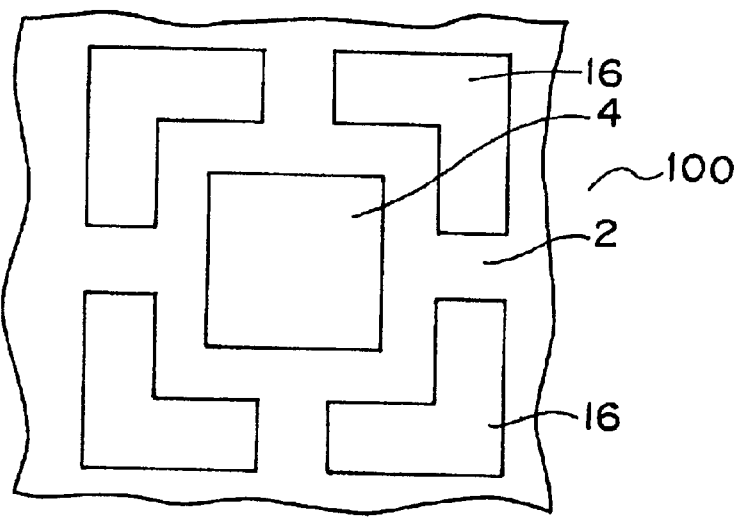

Also, as shown in FIG. 8, each of the second metal layer 16 may be an L-shaped layer, which surrounds the corner of the recess 4. As described above, at the corner of the recess 4, a stress in concentrated, causing the formation of the crack, and the crack tends to extend in a diagonal direction of the recess 4. Therefore, the second metal layer 16, which is opposed to the corner of the recess 4, can terminate the extension of the crack.

Figure 9:
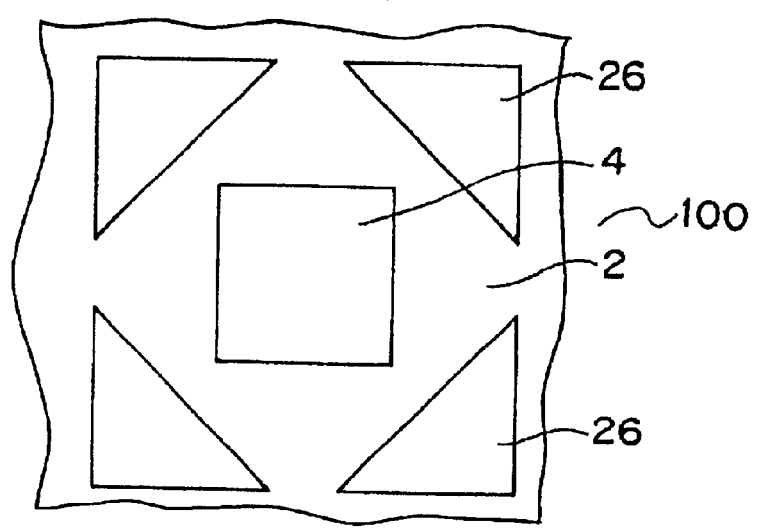

Also, as shown in FIG. 9, each of the second metal layer 26 may be a delta-shaped layer of which one side opposes to the corner of the recess 4. Most of the cracks are generated at the corner of the recess 4, therefore the delta-shaped layer 26 can terminate the extension of the crack.

Figure 10:
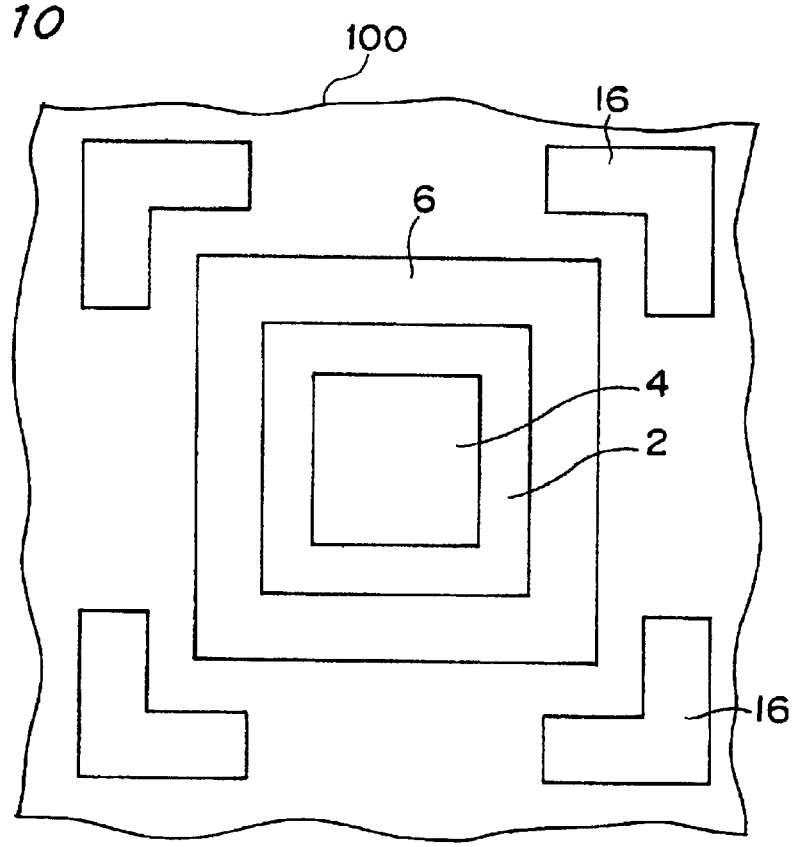
Figure 11:
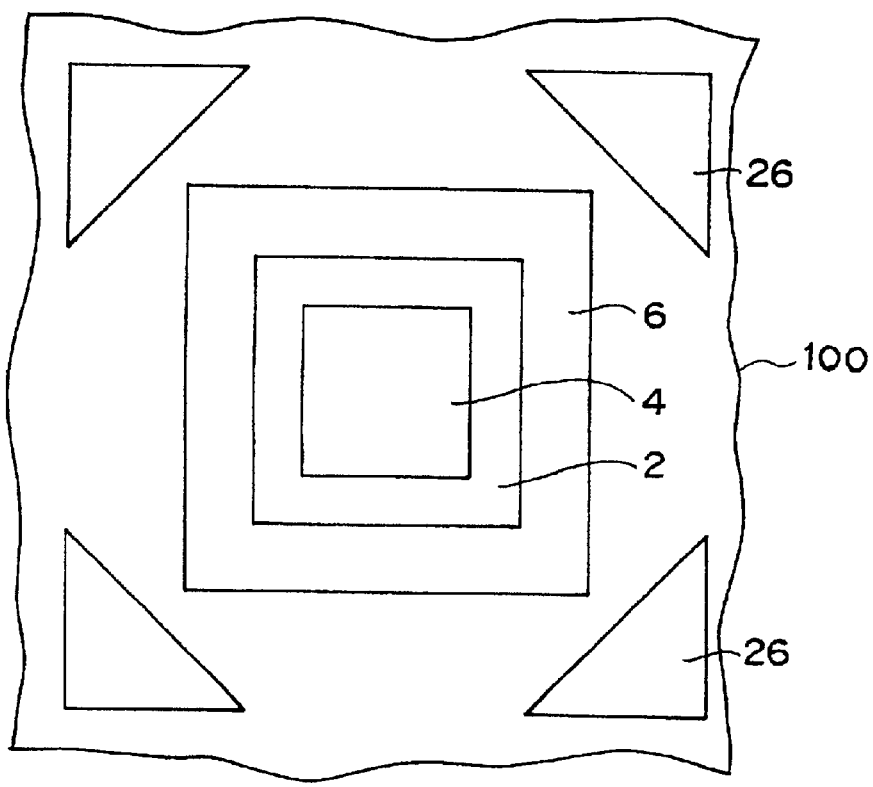
Figure 12:
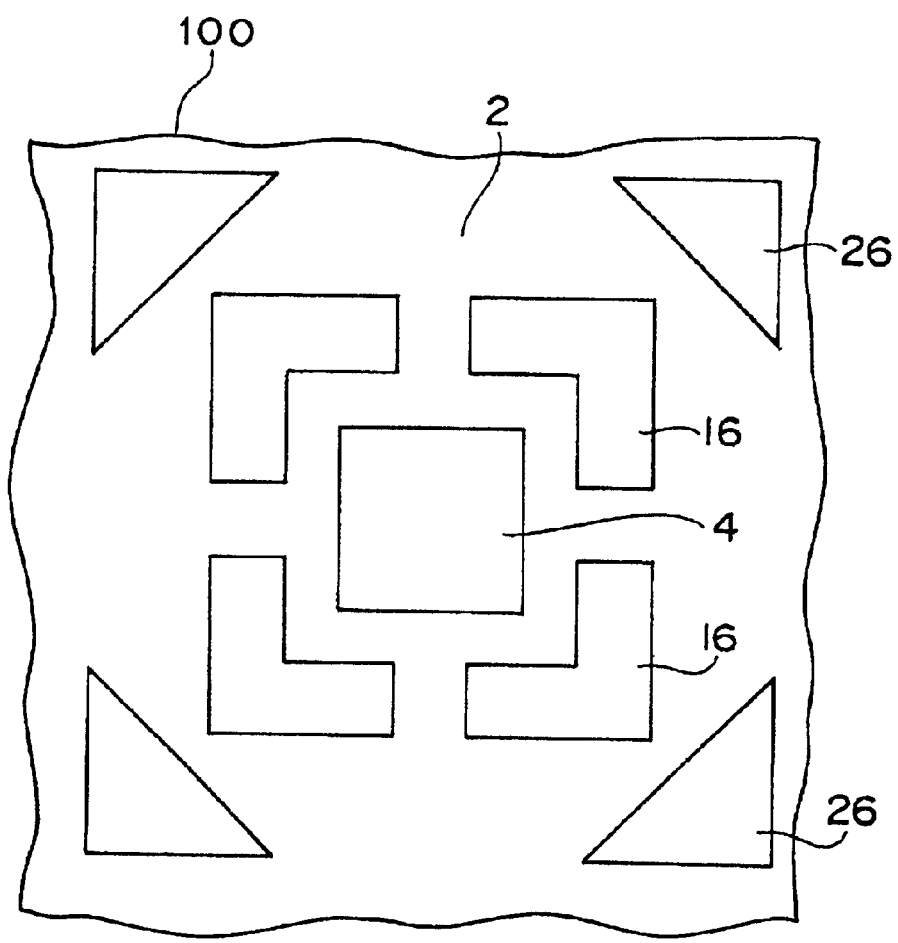
Figure 13A:
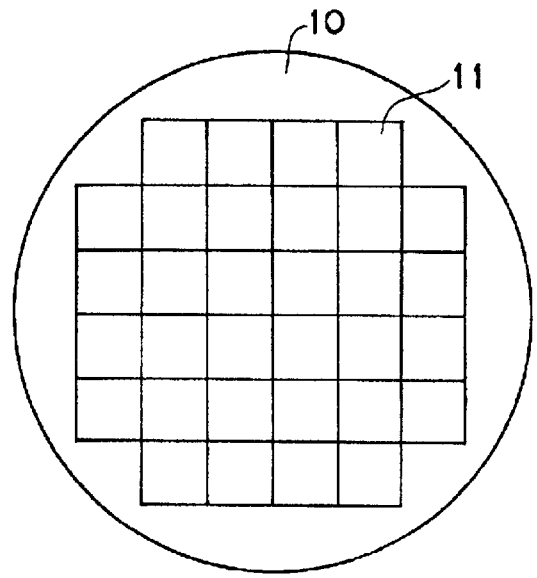
FIG. 13A is a plan view of a semiconductor wafer containing a plurality of semiconductor chips.
Figure 13B:
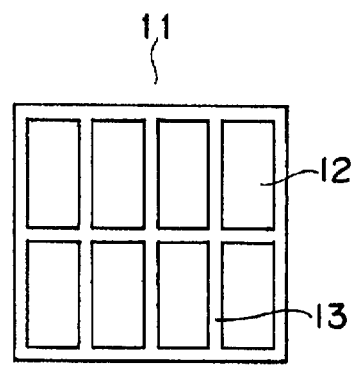
FIG. 13B is an enlarged plan view of the semiconductor chip of FIG. 13A.
Figure 14A:
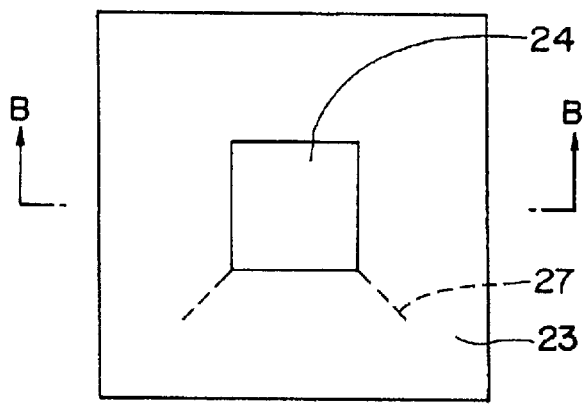
FIG. 14A is a plan view of a conventional semiconductor device having a test mark.
Figure 14B:
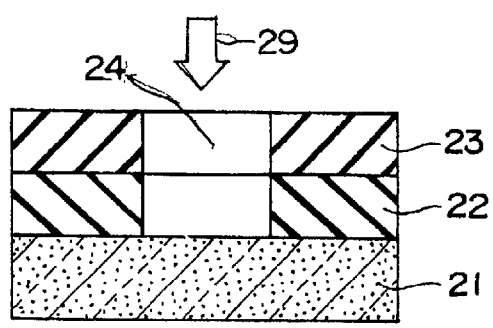
FIG. 14B is a cross sectional view of the semiconductor device along lines B—B in FIG. 14A.
Figure 15A:
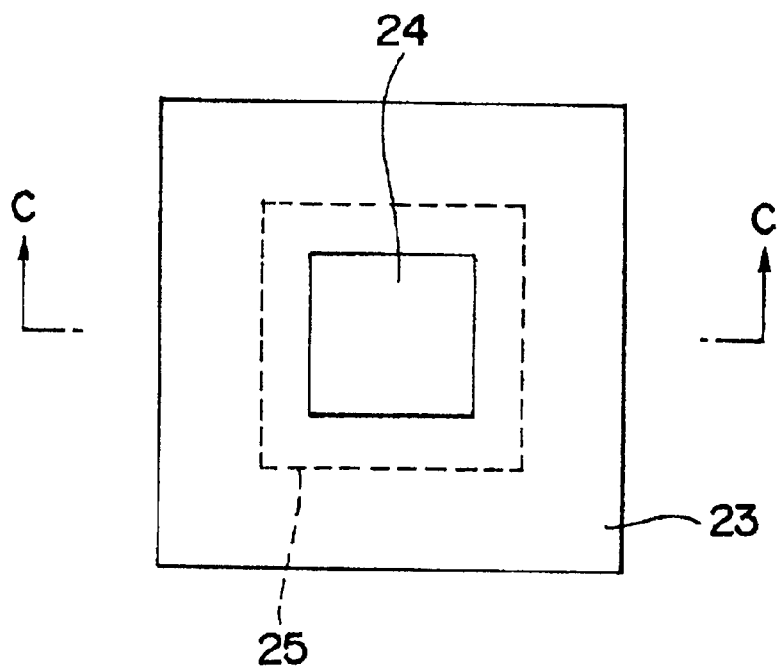
FIG. 15A is a plan view of a conventional semiconductor device having a test mark.
Figure 15B:
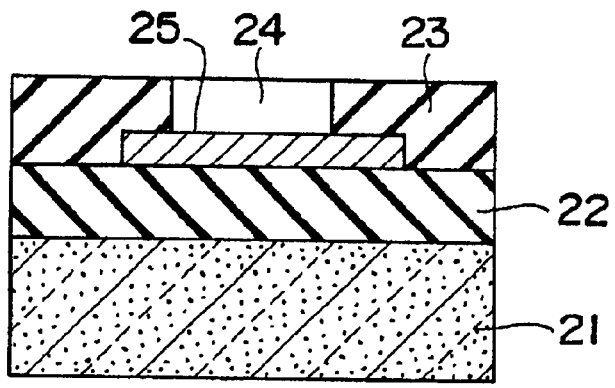
FIG. 15B is a cross sectional view of the semiconductor device along lines C—C in FIG. 15A.

Further, as shown in FIGS. 10 to 12, another metal layer may surround the metal layer described above. That is, referring to FIG. 10, the L-shaped metal layer 16 is formed to be opposed to the each corner of the square-shaped metal layer 6. Also, referring in FIG. 11, the delta-shaped metal layer 26 is formed to be opposed to the each corner of the square-shaped metal layer 6. Further, referring to FIG. 12, the delta-shaped metal layer 26 is formed to be opposed to the each corner of the L-shaped metal layer 16 which is opposed to the corner of the recess 4.

By forming inner and outer metal layers described above, in the case that the crack expands through and outward the inner metal layer, the expansion of the crack can be terminated by the outer metal layer.

It is noted that a first metal layer 5 may be formed beneath these metal layers 6, 16 and 26.

What is claimed is:

1. A semiconductor device having a test mark comprising:
   a semiconductor substrate;
   a first TEOS layer formed on said semiconductor substrate;
   a second TEOS layer formed on said first TEOS layer and having a lower fluidity than that of said first TEOS layer at an elevated temperature;
   a recess formed in said first and second TEOS layers and exposing the surface of said semiconductor substrate, wherein the horizontal cross-section of said recess is substantially rectangular in configuration; and
   a metal layer formed on said first TEOS layer and opposing a corner of said recess.

2. A semiconductor device according to claim 1, wherein said first TEOS layer contains boron and/or phosphorus.

3. A semiconductor device according to claim 1, wherein said metal layer is a square-shaped layer surrounding said recess.

4. A semiconductor device according to claim 1, wherein said metal layer is an L-shaped layer surrounding the corner of said recess.

5. A semiconductor device according to claim 1, wherein said metal layer is a delta-shaped layer of which one side opposes to the corner of said recess.

6. A semiconductor device according to claim 1, further comprising an outer metal layer formed outside of said metal layer so that said outer metal layer opposes to the corner of said recess through said metal layer.

7. A semiconductor device according to claim 1, wherein a lower metal layer is embedded in said first TEOS layer which extends between the top and bottom surfaces each neighboring to said semiconductor substrate and said metal layer.

8. A semiconductor device according to claim 7, wherein said lower metal layer consists of a plurality of cylindrical metal layers.

* * * * *